United States Patent [19]

Ley et al.

[11] Patent Number: 4,507,624
[45] Date of Patent: Mar. 26, 1985

[54] VOLTAGE-TO-FREQUENCY CONVERTERS

[75] Inventors: Anthony J. Ley, Sceaux; Alain Bazin, Villejuif, both of France

[73] Assignee: Enertec, Montrouge, France

[21] Appl. No.: 456,891

[22] Filed: Jan. 10, 1983

[30] Foreign Application Priority Data

Jan. 29, 1982 [FR] France .................. 82 01401

[51] Int. Cl.³ ............................. H03K 13/02
[52] U.S. Cl. .................. 332/11 D; 340/347 NT; 340/347 AD; 340/347 CC
[58] Field of Search ............ 331/135, 136; 324/99 D; 340/347 NT, 347 AD, 347 CC; 332/11 D

[56] References Cited

U.S. PATENT DOCUMENTS 3,789,202  1/1974  Yamanaka .................. 340/347 NT

FOREIGN PATENT DOCUMENTS 2195873  3/1974  France .
1153201  5/1969  United Kingdom .

*Primary Examiner*—Siegfried H. Grimm
*Attorney, Agent, or Firm*—Dale Gaudier

[57] ABSTRACT

A monostable circuit of a voltage-to-frequency converter supplies feedback pulses to balance the input signal to a first integrator. These same pulses are supplied to a second integrator where they are compared with reference pulses from a crystal-controlled clock. Any drift in the pulse-width of the feedback pulses is corrected by a control signal applied to the monostable circuit by the second integrator to vary its quasi-stable period appropriately. Thus the precision of the converter is improved without disturbing its asynchronous properties.

2 Claims, 2 Drawing Figures

VOLTAGE-TO-FREQUENCY CONVERTERS

This invention relates to voltage-to-frequency converters, that is to say circuits which provide an oscillatory output signal having a frequency indicative of the magnitude of an input voltage signal. Such circuits are commonly used, for example, for analogue to digital conversion.

A known form of voltage-to-frequency converter essentially comprises an integrator, a comparator, control circuitry and a source of pulses such as a monostable circuit. The input voltage is supplied to the integrator, the output signal of which is compared with a threshold value by the comparator. Whenever the threshold is exceeded, the comparator signals this to the control circuitry which thereupon triggers the monostable circuit to supply a feedback pulse to the integrator in opposition to the input signal. The instantaneous frequency with which the feedback pulses have to be supplied to maintain the integrator output signal below the threshold depends on the magnitude of the input voltage, and thus provides a numerical indication of that magnitude.

Since there is no independent clock controlling the time of occurrence of each feedback pulse, the achievement of a high level of precision does not involve the problem of choosing between a very high clock rate (requiring specialised circuitry and careful design) and a slow conversion rate. Furthermore, there is no quantisation noise arising from the use of a fixed clock frequency. However, the accuracy of the conversion is dependent on the precision of the timebase of the circuit, which conventionally takes the form of a capacitor in the monostable circuit to determine the feedback pulse width. Consequently, the accuracy is usually no better than 0.1% to 1%. Although this is adequate for many uses, there are certain circumstances, such as the telemetry of measurement signals in electricity transmission and process control systems, where higher precision, high speed conversion is required.

According to one aspect of this invention there is provided a voltage-to-frequency converter arranged to provide an oscillatory output signal having a frequency indicative of the magnitude of an input voltage signal, by integrating pulses at said frequency in opposition to said input voltage signal, characterised in that the pulse-width of said pulses is controlled to maintain it in predetermined relationship with the pulse-width of reference pulses from a reference clock source.

According to another aspect of this invention there is provided a voltage-to-frequency converter comprising integrator means arranged to receive an input voltage signal, comparator means arranged to compare the output signal of said integrator means with a predetermined threshold value, and means arranged to supply feedback pulses to the integrator means in opposition to said input voltage signal at such a frequency as to maintain the output signal of the integrator means in predetermined relationship to said threshold value, characterised by clock means arranged to supply reference pulses, and second comparator means arranged to compare said feedback pulses and said reference pulses and to control the feedback pulse supply means to maintain the pulse-width of said feedback pulses in predetermined relationship with the pulse-width of said reference pulses.

With this invention the pulse-width of the feedback pulses is monitored and stabilised, thereby improving the precision of the conversion operation, without introducing any significant quantisation noise from the clock supplying the reference pulses.

A voltage-to-frequency converter in accordance with this invention will now be described, by way of example, with reference to the accompanying drawings, in which.

Figure 1:
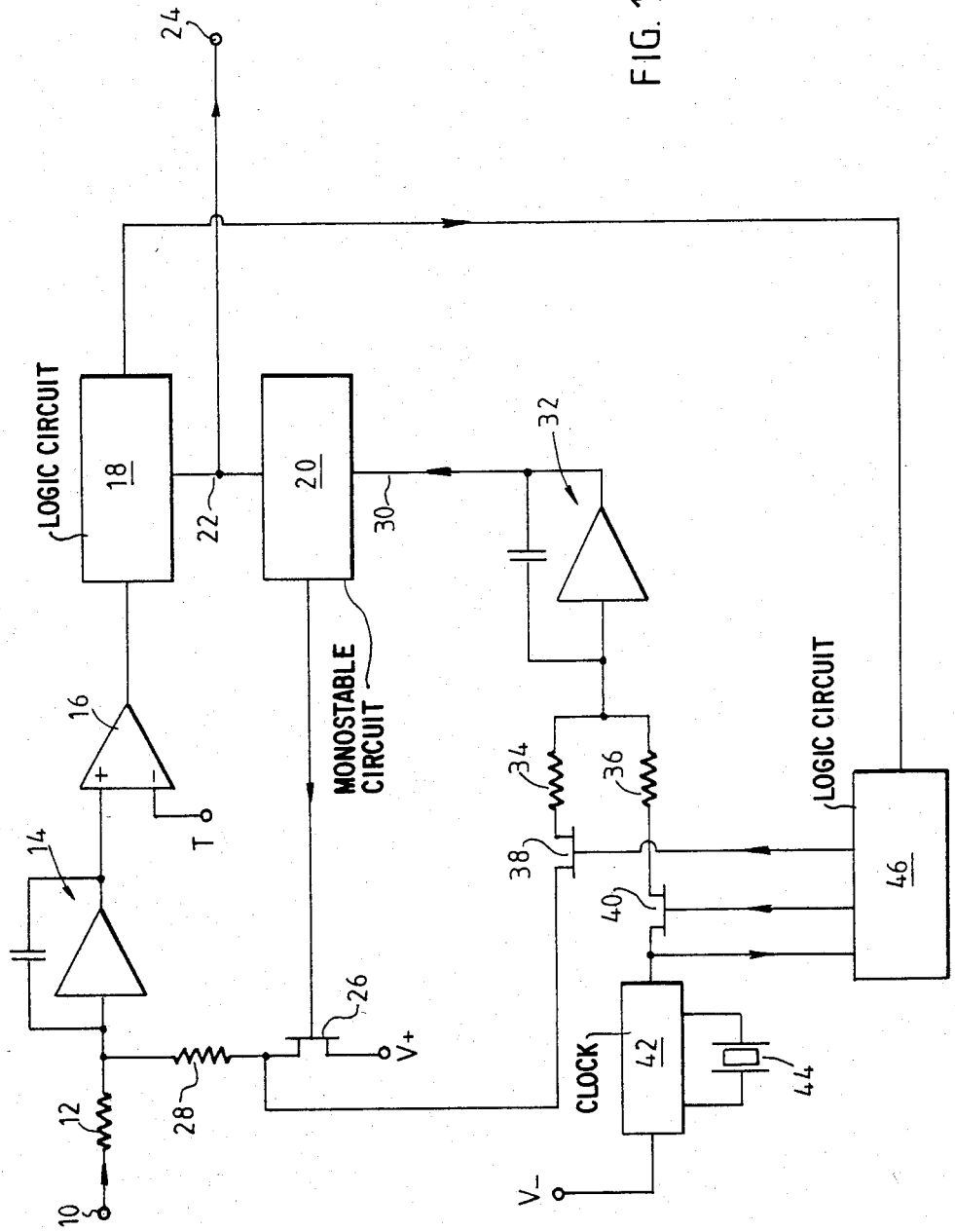
FIG. 1 is a block schematic diagram of the converter.

Referring to FIG. 1, an input voltage signal to be converted to digital form, in this case so that its magnitude is represented by the frequency of another signal, is applied to an input terminal 10. This input terminal is coupled via a resistor 12 to the input of an integrator 14, comprising an operational amplifier with capacitive feedback. The output of the integrator 14 is conneted to one input of a comparator 16, the other input of which receives a threshold voltage T. The comparator 16 in turn supplies an output signal to a first logic circuit 18 which can trigger a monostable circuit 20 via a line 22. This line 22 is also connected to an output terminal 24 of the converter. The output of the monostable circuit 20 is connected to the control terminal of a switch 26 (shown in this case as an MOS transistor controlled via its gate electrode) which couples a positive reference voltage V+ via a resistor 28 to the input of the integrator 14.

The operation of the circuitry described so far is entirely conventional. Thus, assuming the input voltage signal is negative (or that a bipolar input signal is appropriately biassed to this end), the output voltage of the integrator 14 will rise at a rate dependent on the input signal magnitude. When this output voltage reaches the threshold value T, the comparator 16 delivers a signal to the logic circuit 18, which thereupon triggers the monostable circuit 20. This circuit then closes the switch 26 for a period determined by the duration of its quasi-stable state, thereby causing a feedback pulse of corresponding duration and having a magnitude of V+ volts to be applied to the input of the integrator 14. Since this feedback pulse is of opposite polarity to the input signal, it acts to reduce the output voltage of the integrator 14. Furthermore, the logic circuit 18 will continue to trigger the monostable circuit 20 so that sufficient feedback pulses are applied to the integrator 14 to balance the charge applied by virtue of the input signal and thus maintain the output voltage of the integrator 14 no higher than the threshold voltage T. Thus, the rate at which the monostable circuit 20 is triggered, and therefore the repetition frequency of the pulses appearing at the output terminal 24, is dependent upon the magnitude of the input voltage applied to the input terminal 10.

The precision of the relationship between the input signal magnitude and the output signal frequency depends in particular on the stability of the quantity of charge applied by each feedback pulse to the integrator 14. The quantity of charge is in turn related to the amplitude (defined by the reference voltage V+) and width of the feedback pulses.

In order to stabilise the width of the feedback pulses, the monostable circuit 20 is provided with a second input 30 by means of which the duration of its quasi-stable period can be controlled. This input 30 is coupled to the output of a second integrator 32, which receives input signals, via resistors 34 and 36, from two switches 38 and 40 (again shown as MOS transistors). The first of these switches, 38, is connected to receive the same feedback pulses as are applied to the integrator 14 by the switch 26. The other switch 40 is coupled to receive reference pulses from a clock 42 including a crystal frequency source 44 and supplied with a negative reference voltage V—. The magnitude of this reference voltage in relation to that of the positive reference voltage V+ will depend on the choice of other parameters for the clock 42; its polarity must be such that the reference pulses are of opposite polarity to the feedback pulses. The control terminals of the switches 38 and 40 are connected to a second logic circuit 46 which receives signals from the first logic circuit 18 and the reference pulses from the clock 42.

Each time that the logic circuit 18 triggers the monostable circuit 20, it sends a corresponding signal to the logic circuit 46. This circuit selects certain of the corresponding feedback pulses (for example every pulse, or every tenth pulse) and applies them to the input of the second integrator 32 by closing the switch 38. For each pulse thus selected, the logic circuit 46 also selects and applies one and only one reference pulse to the second integrator 32, by operation of the switch 40. Any difference in the charge supplied by the two opposite-polarity pulses will cause the output voltage of the integrator 32 to vary. The monostable circuit 20 is arranged to respond to this voltage on its input 30 by changing the duration of its quasi-stable period in the sense required to reduce the difference in the charges supplied by the two pulses being compared by the integrator. Since the reference pulses are derived from the reference voltage V— and the crystal frequency source 44, their magnitude and pulse-width are stable, so the quantity of charge each supplies to the integrator 32 is the same. Therefore the pulse-width of the feedback pulses will be controlled by the integrator 32 so that these pulses likewise each supply the same quantity of charge, to the integrator 14 as well as the integrator 32. However, by appropriate choice of the value, for example, of the time constant of the integrator 32, it can be arranged that the frequency of the clock 42 does not significantly affect the free-running of the pulse signal appearing at the output terminal 24.

Figure 2:
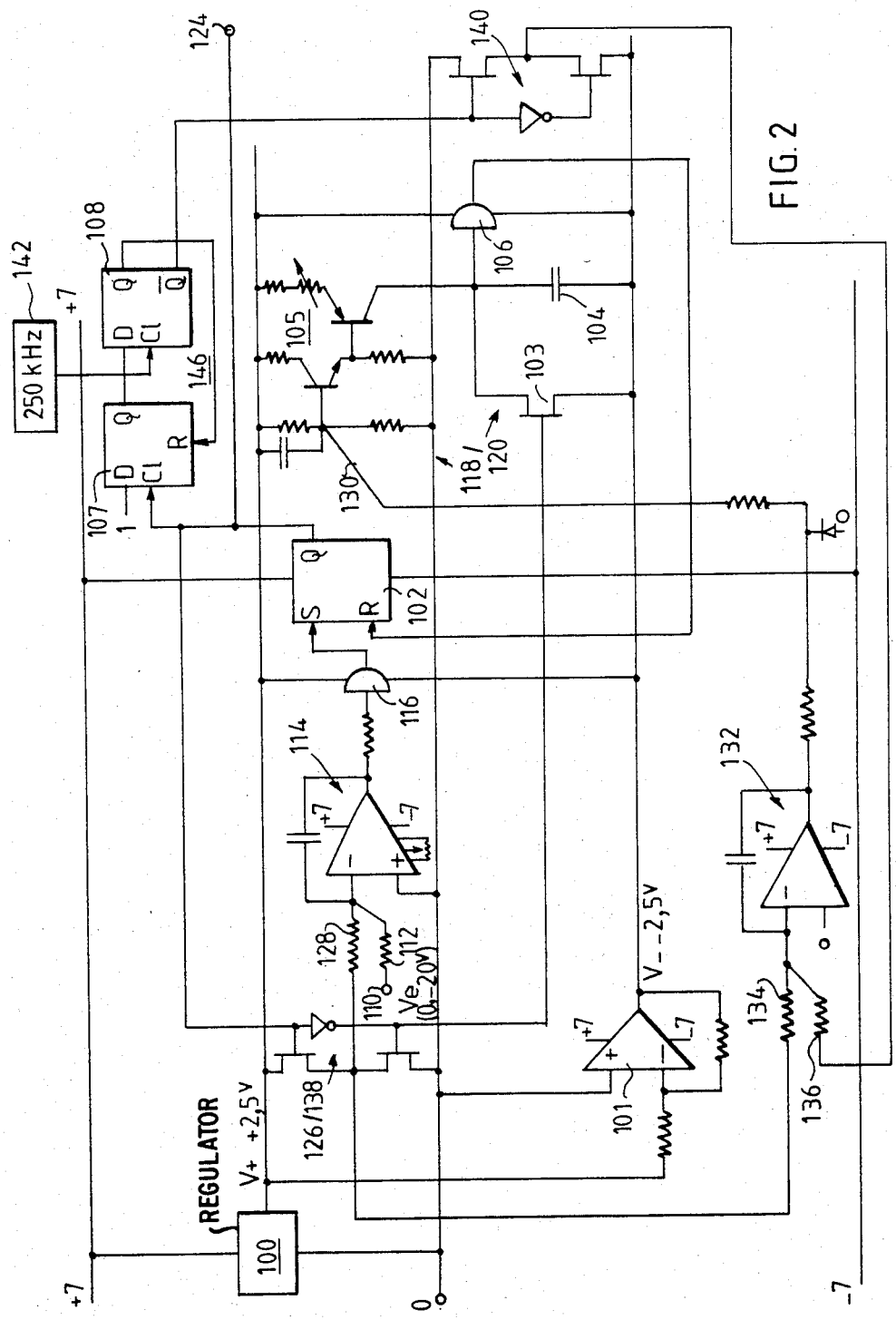
FIG. 2 is a detailed circuit diagram of one embodiment of the converter.

A detailed circuit diagram of one embodiment of the converter is shown in FIG. 2, in which components corresponding generally to the circuit functions shown in FIG. 1 have been given corresponding reference numerals, but increased by 100.

Referring to FIG. 2, a regulator 100 supplies the reference voltage V+, from which the reference voltage V— is derived by an inverter 101. The input voltage signal is supplied via the input terminal 110 and resistor 112 to the integrator 114, the output voltage of which is monitored by the comparator 116. The output of the comparator 116 is supplied to the one set input of an SR bistable circuit 102 which effectively comprises the logic circuit 118 and also forms part of the monostable circuit 120. When this bistable circuit 102 is set, its Q output enables a switch 126/138 (which combines the functions of the switches 26 and 38 in FIG. 1) and disables another switch 103. The switch 126/138 supplies the feedback pulse via the resistor 128 to the integrator 114, and via the resistor 134 to the integrator 132, while the switch 103 removes a short-circuit from a capacitor 104 in the monostable circuit 120. The voltage across this capacitor 104 thus starts to rise at a rate determined by the current supplied by a controllable current source 105. A comparator 106 monitors this voltage and, when it reaches the threshold defined by V+, resets the bistable circuit 102, thereby terminating the feedback pulse. The output terminal 124 is connected to the Q output of the bistable circuit 102.

The Q output of the bistable circuit 102 is also coupled to the clock input of a first D-type bistable circuit 107, the D input of which is coupled to logic 1. Thus, when the bistable circuit 102 is set, the Q output of this D-type bistable circuit 107 applies a logic 1 signal to the D input of a second D-type bistable circuit 108. The clock input of this second circuit 108 receives the reference pulses from the clock 142, and its Q output is coupled back to the reset input of the first circuit 107 so that the occurrence of the next reference pulse resets that circuit 107. Thus, one and only one reference pulse will appear at the inverted-Q output of the circuit 108. (In this particular case, a reference pulse comprises one full cycle of the signal supplied by the clock 142.)

The inverted-Q output of the D-type bistable circuit 108 controls the switch 140, which thus supplies the reference pulse to the integrator 132 via the resistor 136. The output of the integrator 132 is coupled to the current source 105 to control its conductivity and vary the rate at which the capacitor 104 charges, thereby varying the duration of the quasi-stable state of the monostable circuit 120.

We claim:

1. In a voltage-to-frequency converter of the type including integrator means for receiving an input voltage signal and for producing an output signal therefrom, comparator means responsive to the integrator means for comparing the output signal of said integrator means with a predetermined threshold value, and means responsive to the comparator means for generating and applying feedback pulses to the integrator means of opposite polarity to that of said input voltage signal and at such a frequency as to maintain the output signal of the integrator means in a predetermined relationship to said threshold value, a method of controlling said feedback pulses, comprising the steps of:
    (a) generating a series of reference pulses;
    (b) comparing said reference pulses with said feedback pulses; and
    (c) controlling the feedback pulse generating means to maintain the pulse-width of said feedback pulses in a predetermined relationship with the pulse-width of said reference pulses.

2. A voltage-frequency converter of the type including integrator means for receiving an input voltage signal and for producing an output signal therefrom, comparator means responsive to the integrator means for comparing the output signal of said integrator means with a predetermined threshold value, and means responsive to the comparator means for comparing the output signal of said integrator means with a predetermined threshold value, and means responsive to the comparator means for generating and applying feedback pulses to the integrator means of opposite polarity to that of said input voltage signal and at such a frequency as to maintain the output signal of the integrator means in a predetermined relationship to said threshold value, wherein the improvement comprises:
    (a) means for generating a series of reference pulses; and
    (b) means responsive to said feedback pulses and said reference pulses for controlling the feedback pulse generating means to maintain the pulse-width of said feedback pulses in a predetermined relationship with the pulse-width of said reference pulses.

* * * * *